(12) United States Patent
Anderson et al.

(10) Patent No.: US 8,969,195 B2
(45) Date of Patent: Mar. 3, 2015

(54) METHODS OF MANUFACTURING SEMICONDUCTOR DEVICES AND A SEMICONDUCTOR STRUCTURE

(75) Inventors: Felix P. Anderson, Colchester, VT (US); Steven P. Barkyoumb, Burlington, VT (US); Edward C. Cooney, III, Jericho, VT (US); Thomas L. McDevitt, Underhill, VT (US); William J. Murphy, North Ferrisburgh, VT (US); David C. Strippe, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 1666 days.

(21) Appl. No.: 12/035,449

(22) Filed: Feb. 22, 2008

(65) Prior Publication Data

US 2009/0212434 A1     Aug. 27, 2009

(51) Int. Cl.
| | |
|---|---|
| H01L 21/44 | (2006.01) |
| H01L 21/285 | (2006.01) |
| C23C 14/02 | (2006.01) |
| C23C 14/06 | (2006.01) |
| H01L 21/768 | (2006.01) |

(52) U.S. Cl.
CPC ............ *H01L 21/2855* (2013.01); *C23C 14/02* (2013.01); *C23C 14/0641* (2013.01); *H01L 21/76843* (2013.01)
USPC ........... 438/653; 438/627; 438/643; 438/648; 438/656; 257/486; 257/751; 257/761; 257/E21.584; 257/E21.202

(58) Field of Classification Search
CPC ...................... H01L 21/2855; H01L 21/76843
USPC .......... 438/648, 653, 656, 627, 643; 257/486, 257/751, 761, E21.584, E21.202
See application file for complete search history.

(56) References Cited

U.S. PATENT DOCUMENTS

| | | | |
|---|---|---|---|
| 6,117,769 A * | 9/2000 | Nogami et al. ............... 438/653 |
| 6,184,073 B1 * | 2/2001 | Lage et al. ..................... 438/238 |
| 6,743,473 B1 | 6/2004 | Parkhe et al. | |
| 6,905,959 B1 * | 6/2005 | Ashtiani et al. ............... 438/648 |
| 6,951,804 B2 | 10/2005 | Seutter et al. | |
| 7,189,649 B2 | 3/2007 | Teng et al. | |
| 7,241,686 B2 | 7/2007 | Marcadal et al. | |
| 2002/0058163 A1 | 5/2002 | Uzoh et al. | |

* cited by examiner

Primary Examiner — Kimberly Rizkallah
Assistant Examiner — Maria Ligai
(74) Attorney, Agent, or Firm — David Cain; Roberts Mlotkowski Safran & Cole, P.C.

(57) ABSTRACT

Processes for improving adhesion of films to semiconductor wafers and a semiconductor structure are provided. By implementing the processes of the invention, it is possible to significantly suppress defect creation, e.g., decrease particle generation, during wafer fabrication processes. More specifically, the processes described significantly reduce flaking of a TaN film from edges or extreme edges (bevel) of the wafer by effectively increasing the adhesion properties of the TaN film on the wafer. The method increasing a mol percent of nitride with respect to a total tantalum plus nitride to 25% or greater during a barrier layer fabrication process.

24 Claims, 8 Drawing Sheets

METHODS OF MANUFACTURING SEMICONDUCTOR DEVICES AND A SEMICONDUCTOR STRUCTURE

FIELD OF THE INVENTION

The present invention generally relates to methods of manufacturing semiconductor devices, and more specifically, to processes for improving adhesion of films to semiconductor wafers and a semiconductor structure.

BACKGROUND OF THE INVENTION

Production of semiconductor integrated circuits and other microelectronic devices from semiconductor wafers requires formation of one or more metal layers on a wafer. These metal layers are used, for example, to electrically interconnect various devices of the integrated circuit. These metal layers may be, for example, nickel, tungsten, solder, and copper. These metals can be deposited using various different techniques such as, for example, chemical vapor deposition (CVD), physical vapor deposition (PVD), electroplating, and electroless plating.

Prior to the formation of metal interconnects, a barrier layer is formed in patterned structures such as, for example, vias, trenches or other features. The barrier layer is used to prevent movement of materials between the circuit patterns into an adjacent dielectric layer. The barrier layer is typically tantalum, or tantalum nitride, deposited into the vias and trenches by PVD processes. After the barrier layer is formed, a copper seed layer, for example, is deposited over the barrier layer and, thereafter, an electroplating process forms the copper interconnect layer.

However, it has been found that during the fabrication (e.g., PVD process) of the barrier layer, tantalum or tantalum nitride also deposits on the wafer. This forms a metal film on the entire wafer surface including at the edges and extreme edges or bevel of the wafer. This layer is very thin, typically in the range of 2 to 100 nanometers. It has also been found that the adhesion of the thin film to the wafer is not very reliable due to, at least, the concentration of the nitrogen (a mol percentage of less than 20%) to tantalum. It is also theorized that damage by semiconductor wafer processing steps, such as the damascence reactive ion etching (RIE) process, as well as from ion bombardment as a secondary result of the PVD process, causes damage to the near-silicon surface at the wafer edge. This damage then in turn promotes poor adhesion of dielectric layers that are deposited overtop the silicon wafer. The subsequent poor adhesion of the TaN layer, and exacerbated by its low nitrogen content, leads to subsequent flaking of the Tan and any material overtop the TaN barrier at the wafer edge and extreme edge. Due to the chemical composition of the TaN, this film has a tendency to flake off during subsequent processes of the integrated circuit.

This flaking, in turn, results in an increase in defect creation. More specifically, due to stresses imposed on the wafer in subsequent processes, the thin film of TaN flakes off, resulting in a significant increase in particle generation. This increase in particle generation will significantly reduce product yield and device reliability.

Accordingly, there exists a need in the art to overcome the deficiencies and limitations described hereinabove.

SUMMARY OF THE INVENTION

In a first aspect of the invention, a structure comprises a wafer having an edge and extreme edges. A trough and/or via is formed within a dielectric on the wafer. The trough and/or via has a barrier of TaN (tantalum nitride) (or TaSiN) with a mol percentage of N with respect to a total Ta plus N being from about 25% to 90%. The edge and extreme edges of the wafer have TaN deposited thereon with the mol percentage of N with respect to the total Ta plus N being from about 25% to 90%.

In an additional aspect of the invention, a method of fabricating a semiconductor structure comprises increasing a mol percent of nitride with respect to a total tantalum plus nitride to 25% or greater during a barrier layer fabrication process.

In embodiments, the mol percentage of the nitride is increased to a range of about 25% to 90%. The mol percentage of the nitride is increased to a range of about 30% to 35%. The mol percentage of the nitride is increased by introducing nitrogen into a chamber prior to a Pressure Vapor Deposition (PVD) process. A ratio of nitrogen to argon during the PVD process is at a ratio of about 2.5:1 or greater. The nitrogen is provided at a flow rate of between about 5 sccm to 300 sccm. The nitrogen is provided at a flow rate of about 80 sccm. The mol percentage of the nitride is increased by providing a power to the chamber of between about 100 W to 2 KW. The mol percentage of the nitride is increased by providing a negative charge to a wafer during a PVD process. The negative voltage is in a range of about −25V to −500V. The mol percentage of the nitride is increased by introducing nitrogen as a heat transfer medium between a wafer and a chuck such that the nitrogen leaks from a back side of the wafer to a surface of the wafer. The flow rate of the nitrogen is between about 5 sccm to 100 sccm. The flow rate of the nitrogen is about 20 sccm. The mol percentage of the nitride is increased by increasing a pressure of a chamber during a PVD process to about 20 mT.

In a further aspect of the invention, a method of fabricating a semiconductor structure comprises adjusting a parameter in a chamber to increase a mol percent of nitride to 25% or greater with respect to a total tantalum plus nitride during a Pressure Vapor Deposition (PVD) process.

In yet another aspect of the invention, a method of depositing a barrier layer in a trough or via, comprises introducing nitrogen into a deposition chamber such that a resultant mol percentage of nitride with respect to tantalum plus nitride is about 25% to 90%. In embodiments, the introducing of nitrogen comprises at least one of: introducing nitrogen into the chamber prior to a PVD process, wherein a ratio of nitrogen to argon during the PVD process is at a ratio of greater than 2.5:1; providing a power to the chamber of between about 100 W to 2 KW; introducing nitrogen as a heat transfer medium between a wafer and a chuck such that the nitrogen leaks from a back side of the wafer to a surface of the wafer, wherein a flow rate of the nitrogen is between about 5 sccm to 100 sccm; attenuating a voltage applied to the wafer to a range of about −25V to −200V; and increasing a pressure of the chamber during the PVD process to about 20 mT.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention generally relates to processes for improving adhesion of films to semiconductor wafers and a semiconductor structure. By implementing the processes of the invention, it is now possible to significantly suppress defect creation, e.g., decrease particle generation, during wafer fabrication processes. More specifically, the processes described herein will significantly reduce flaking of a TaN film from edges or extreme edges (bevel) of the wafer by effectively increasing the adhesion properties of the TaN film on the wafer. The processes discussed herein will increase product yield and device reliability.

In one aspect of the invention, the suppression of defect creation is provided by improving the adhesion of TaN films (including, for example, derivates thereof such as TaSiN) to a wafer and more specifically to an edge and/or extreme edges of the wafer. As discussed herein, the advantages of the present invention are possible by increasing the mol percentage of nitrogen to tantalum, compared to that which is conventionally used in semiconductor processing. The mol percentage of nitrogen may be increased, for example, to about 25% or more with relation to the tantalum. That is, the mol percentage of nitrogen with respect to the total Ta plus N is preferably greater than 25%. More specifically, by implementing the processes herein, the present invention contemplates increasing the nitrogen mol percentage (with respect to a total for Ta plus N) to a range of about 25% to 90% and more particularly to a range of about 30% to 35%. It is possible to increase the mol percentage of nitrogen by improving conventional pressure vapor deposition processes (PVD) currently used to manufacture semiconductor devices. It should be understood by those of skill in the art that conventional PVD processes currently provide only about a mol percentage of 20% or less of nitrogen.

Structure of the Invention

Figure 1:
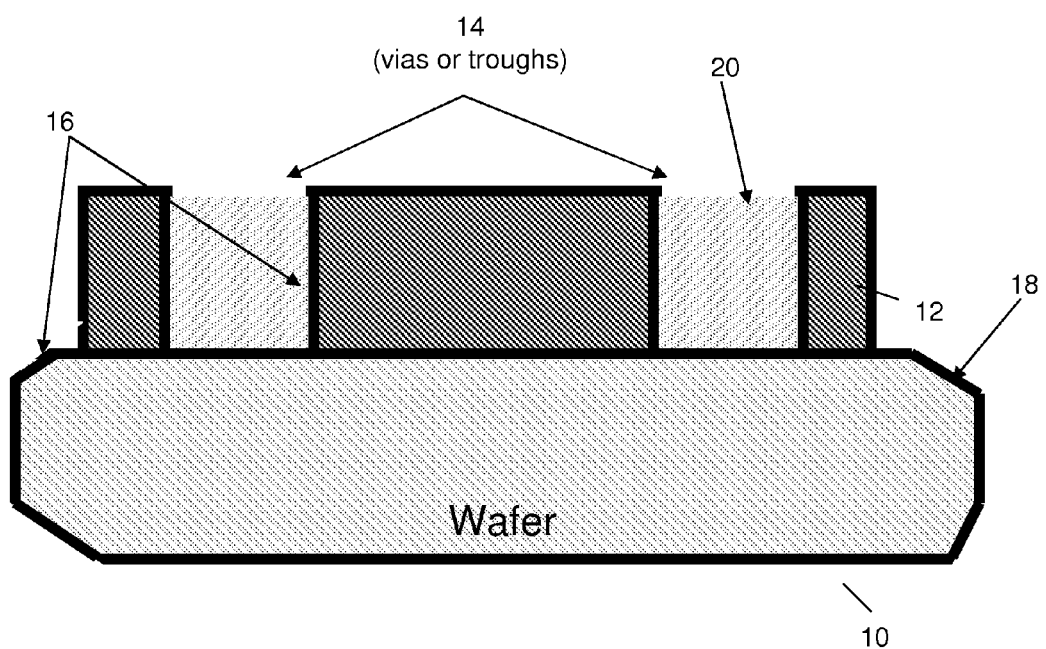
FIG. 1 shows an exemplary structure fabricated in accordance with aspects of the invention.

FIG. 1 shows a structure which was fabricated using the processes of the invention. As should be the understood by those of skill in the art, TaN film is typically used in the formation of wires between layers of a semiconductor device. Conventionally, the semiconductor device is manufactured by etching vias and/or troughs 14 into a dielectric layer 12 on a wafer 10. The dielectric layer 12 can be any dielectric layer such as, for example, $SiO_2$, fluorinated silicon, carbon doped silicon, etc.

The vias and/or troughs 14 are patterned using conventional processes. By way of illustration, a resist is placed over the dielectric layer 12. Selective portions of the resist are exposed to form openings. In subsequent processes, an etching takes place in order to form the vias and/or troughs 14 in the dielectric layer 12. The resist is then stripped.

Once the vias and/or troughs 14 are formed, a barrier layer 16 is deposited within the vias and/or troughs 14. This barrier layer 16, by the nature of the deposition process, is also deposited on the remaining portions of the structure including, for example, the edge and extreme edges 18 of the wafer 10. (It is at the edge and extreme edges 18 of the wafer 10 that flaking results, which contributes to defect creation at later processes steps due to stresses imposed on the wafer, for example).

The barrier layer 16 can be, for example, Ta, TaN or Ta followed by a deposition of TaN or TaSiN, to name a few. In the embodiments of the invention, the mol percentage of nitrogen (with respect to a total for Ta plus N) is at about 25% or greater and can range from about 25% to 90% and is preferably about 30% to 35%. The higher mol percentage of nitrogen significantly increases the adhesion of the TaN to the wafer thus significantly decreasing the defect creation in subsequent processing steps.

The TaN (or TaSiN, etc.) film 16 can range between about 2 nm to 50 nm in the vias and/or troughs 14 and about 10% to 100% of such at the edge and extreme edges 18 of the wafer 10. Typically, the lower range of the thickness of the TaN film is provided at lower wiring levels; whereas, the high range of the thickness of the TaN film is provided at higher wiring levels.

In additional processing steps, a seed layer of copper or copper alloy 20 is provided in the vias and/or troughs 14. The seed layer 20 supports the formation of the copper wiring (also shown as reference numeral 20), via an electroplating process. The structure is then planarized using, for example, chemical mechanical polishing (CMP). The processes described herein can be repeated for higher wiring layers.

Figure 2:
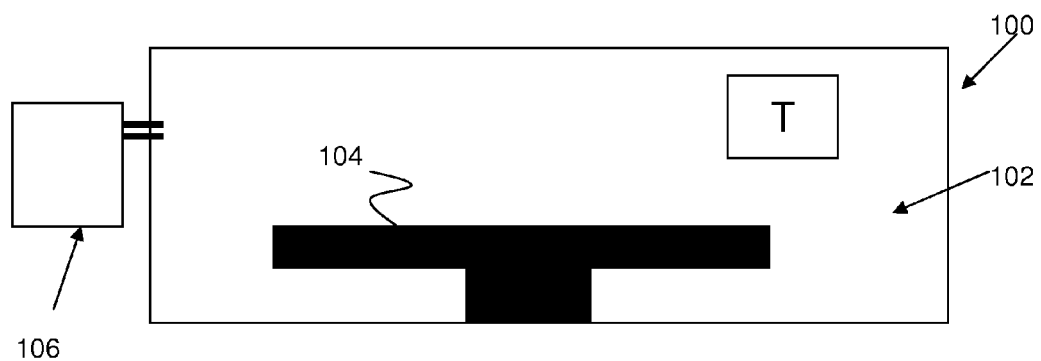
FIG. 2 shows an exemplary processing chamber used with processes in accordance with aspects of the invention.

Exemplary Chamber used in Implementing Processes in Accordance with the Invention FIG. 2 is a schematic representation of a processing chamber implementing the processes of the invention. In particular, the processing chamber, generally depicted as reference numeral 100, is used for PVD processes. The chamber 100 includes an interior portion 102 having a wafer platen and electrostatic chuck (ESC), generally depicted as reference numeral 104. (In conventional chambers, the wafer is held to the platen by an electrostatic force and an inert gas such as, for example, argon or helium, is used as a heat transfer medium (between the ESC and the wafer) in order to cool the wafer.) The chamber 100 also includes other components employed for physical vapor deposition processes, for example gas supplies and valves, temperature and pressure controls and instruments, process timing devices, etc., all generally depicted at reference numeral 106. The chamber 100 also includes a target, T, comprised of Tantalum.

Processes in Accordance with the Invention

It should be recognized by those of skill in the art that each of the aspects of the invention, disclosed below, can be provided in different combinations and permutations. For example, it is contemplated that each and any of the aspects of the invention and embodiments thereof can be combined to increase the mol percentage of nitrogen.

Also, the methods as described herein are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

First Aspect of the Invention

In a first aspect of the invention, prior to the PVD process, a flow of nitrogen is introduced into the chamber. The flow of nitrogen increases the nitrogen in the chamber during the PVD process. As should be understood by those of skill in the art, the nitrogen introduced into the chamber will mix with the TaN (or other elements included with the TaN, e.g., TaSiN) during the PVD process.

In embodiments, the nitrogen is provided at a flow rate of between about 5 sccm to 300 sccm and preferably at about 80 sccm. The flow rate can continue for about between one to 60 seconds and preferably about 15 seconds with an 80 sccm flow rate. In further embodiments, the flow of nitrogen can continue with the PVD process.

In embodiments, the nitrogen introduced prior to the PVD process will accumulate in the chamber, including on the surfaces of the wafer. More specifically, during the PVD process, argon will etch away the tantalum forming TaN on the surface of the wafer; however, due to the additional nitrogen flow introduced into the chamber, the nitrogen concentration will increase, thereby increasing the mol percentage of nitrogen deposited on the wafer. In embodiments, the nitrogen mol percentage can increase to about 25% or more, as discussed above. This, in turn, will improve the adhesion of the barrier layer on the edge and extreme edges of the wafer.

In embodiments of the invention, a ratio of the nitrogen to argon can be about 4:1, with nitrogen being in the greater concentration. In further embodiments, the ratio of nitrogen to argon can range from about 2.5:1 or greater. As one illustrative, non-limiting example, the nitrogen can be introduced into the chamber at 80 sccm and the argon can be introduced into the chamber at about 20 sccm or less.

Second Aspect of the Invention

In another aspect of the invention, the power (watts) used in the PVD process can be decreased compared to conventional processes. By way of example, depending on the particular chamber, conventional power usage is in the range of about 10 KW to about 50 KW. Comparatively, in embodiments of the invention, the power is decreased to about 2 KW, but depending on the chamber can vary between 100 W to 2 KW.

By decreasing the power, the etch rate of the tantalum will be effectively decreased over time. This, in turn, will allow more saturation time for the nitrogen to deposit on the wafer. Accordingly, the mol percentage of nitrogen will increase, preferably to the mol target of about 25% or more. This, in turn, will improve the adhesion of the barrier layer on the edge and extreme edges of the wafer.

Third Aspect of the Invention

In another aspect of the invention, the voltage applied to the wafer during the PVD process can be attenuated to effectively increase nitrogen deposition. For example, in embodiments of the invention, a negative charge can be applied to the wafer (which acts as an anode). The negative voltage, in turn, will bias the wafer and attract nitrogen ions which, again, will increase the percentage of nitrogen to tantalum deposited on the wafer. In embodiments, the voltage can be attenuated to the range of about −25V to −500V and preferably about −200V. In this way, the mol percentage of nitrogen to tantalum will increase, preferably to the mol target of about 25% or more.

Fourth Aspect of the Invention

In a further aspect of the invention, nitrogen can be introduced between the ESC and the wafer as the heat transfer medium. In this aspect of the invention, the flow of nitrogen between the ESC and the wafer will not only act as the heat flow medium, but also will mix with the TaN (or other elements included with the TaN, e.g., TaSiN) during the PVD process. That is, in embodiments, the flow of nitrogen will leak from the back side of the wafer to increase the mol percentage of nitrogen. As discussed above, the introduction of nitrogen (apart from the actual PVD process) will increase the mol percentage of nitrogen deposited on the wafer. In this way, the mol percentage of nitrogen to tantalum will increase, preferably to the mol target of about 25% or more.

In embodiments, the flow rate of nitrogen can range from between about 5 sccm to 100 sccm. In a more preferred embodiment, the flow rate of nitrogen is about 20 sccm.

Fifth Aspect of the Invention

In still another aspect of the invention, a pressure of the chamber can be increased during the PVD process. The increased pressure will increase the percentage of nitrogen to tantalum in the chamber. For example, in conventional processes, the operating pressure of the chamber is about 2 mT to 3 mT. However, the present invention contemplates an increase to the operating pressure to about 20 mT. By increasing the pressure, it is possible to increase the nitrogen atoms in the chamber. As such, as the tantalum moves about the chamber more nitrogen atoms will react with the tantalum. This, in turn, will increase the mol percentage of nitrogen to tantalum, preferably to the mol target of about 25% or more.

Figure 3:
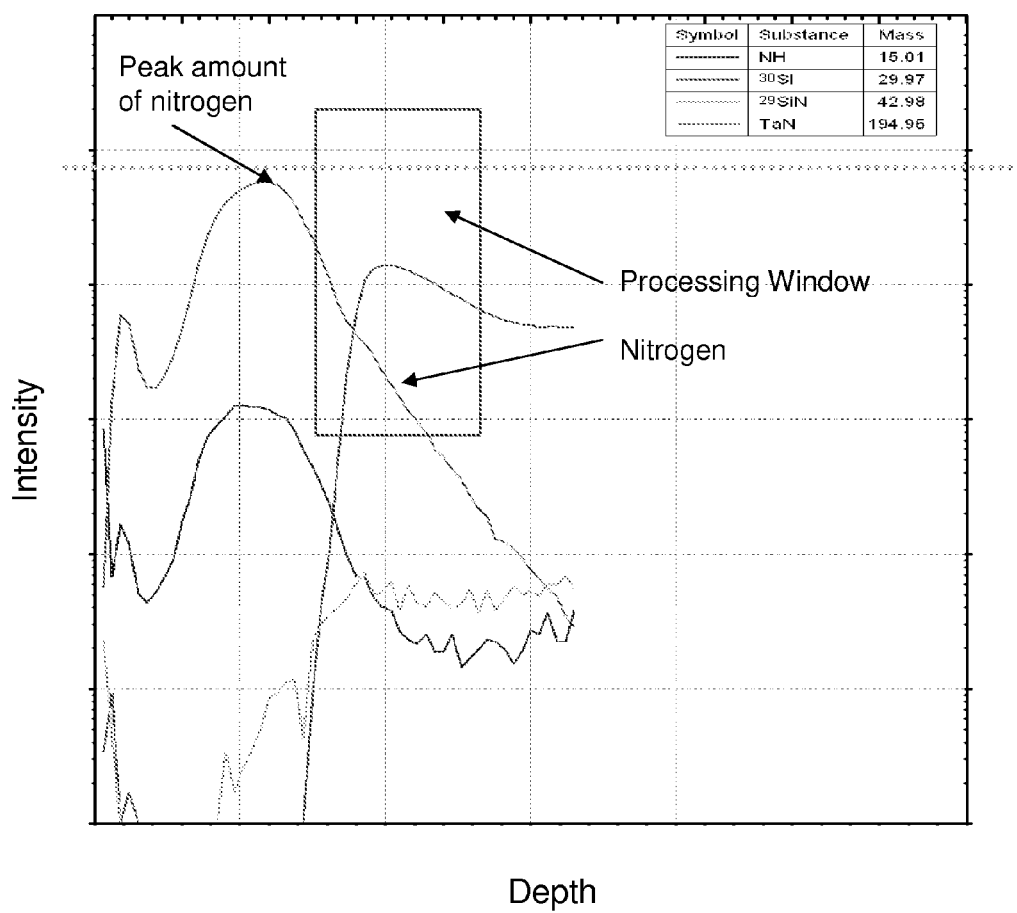
FIG. 3 graphically shows secondary ion mask spectroscopy (SIMS) data on nitrogen effects using a conventional process.

Graphical Representations of Exemplary Results in Accordance with Aspects of the Invention FIG. 3 shows a graph of SIMS (Secondary Ion Mask Spectroscopy) Data on nitrogen effects at the edge of a wafer using a conventional process. This graph is provided for comparison to the graphs depicted in FIGS. 4A-4C, which implement processes in accordance with the invention. In particular and of interest, the SIMS data shows nitrogen deposition in a processing window, where the peak of the nitrogen is below the dashed line. This indicates a level of nitrogen at a certain depth on the wafer.

Figure 4A:
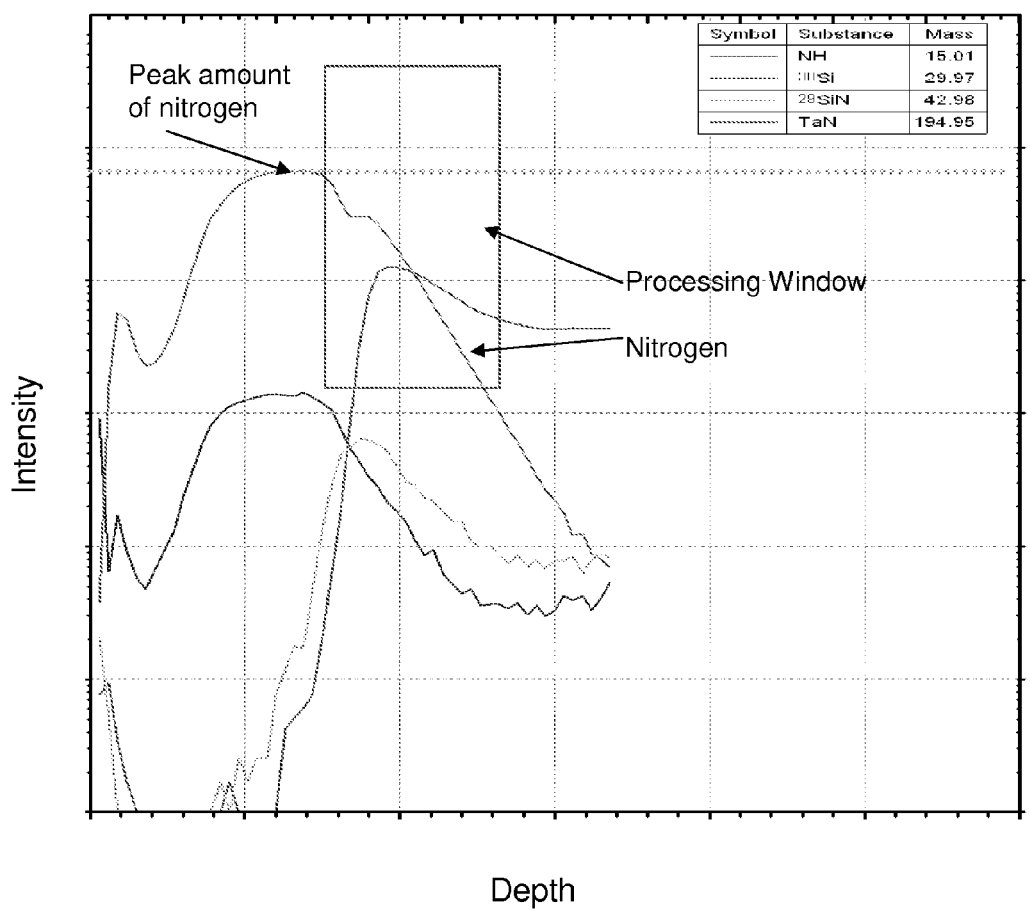
FIGS. 4A-4C graphically show SIMS data on nitrogen effects using processes in accordance with the invention.
Figure 4B:
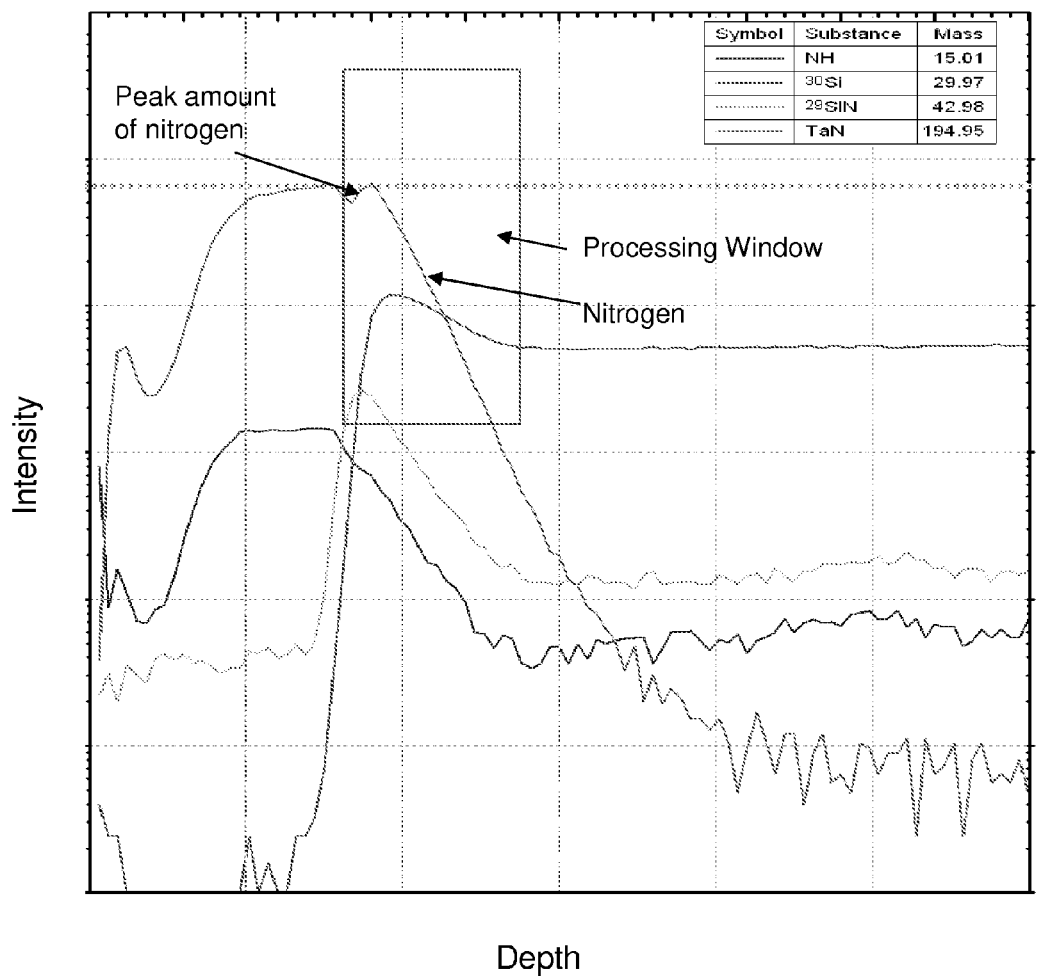
Figure 4C:
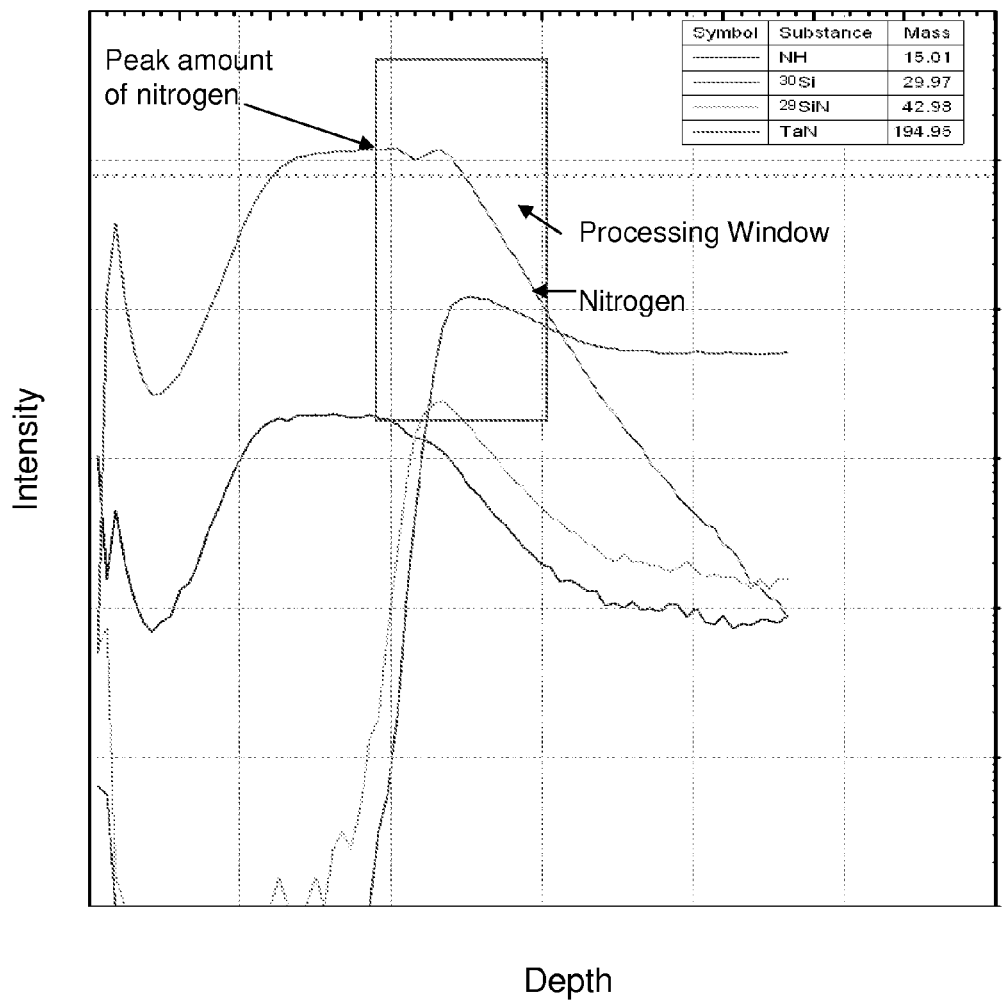

In comparison, FIGS. 4A-4C, show graphs of SIMS Data on nitrogen effects at the edge of a wafer using processes in accordance with the invention. As shown in FIGS. 4A-4C, the peaks of the nitrogen in the processes according to the invention are at or above the dashed line, indicating a higher concentration of nitrogen on the wafer (compared to that of conventional processes).

In particular, the graph of FIG. 4A shows a level of nitrogen using the processes according to the first aspect of the invention, e.g., introducing nitrogen into the chamber prior to the PVD process and maintaining a ratio of nitrogen to argon at about 4:1. The graph of FIG. 4B shows a level of nitrogen using the processes according to the first aspect of the invention, e.g., introducing nitrogen into the chamber at a flow rate of 80 sccm for about 15 seconds and maintaining such flow rate throughout the PVD process. FIG. 4C shows a level of nitrogen using the combination of processes in each aspect of the invention combined. As shown graphically in FIG. 4C, the nitrogen level in this SIMS data is greater than each of the test results shown in FIGS. 4A and 4B (as well as FIG. 3).

Figure 5A:
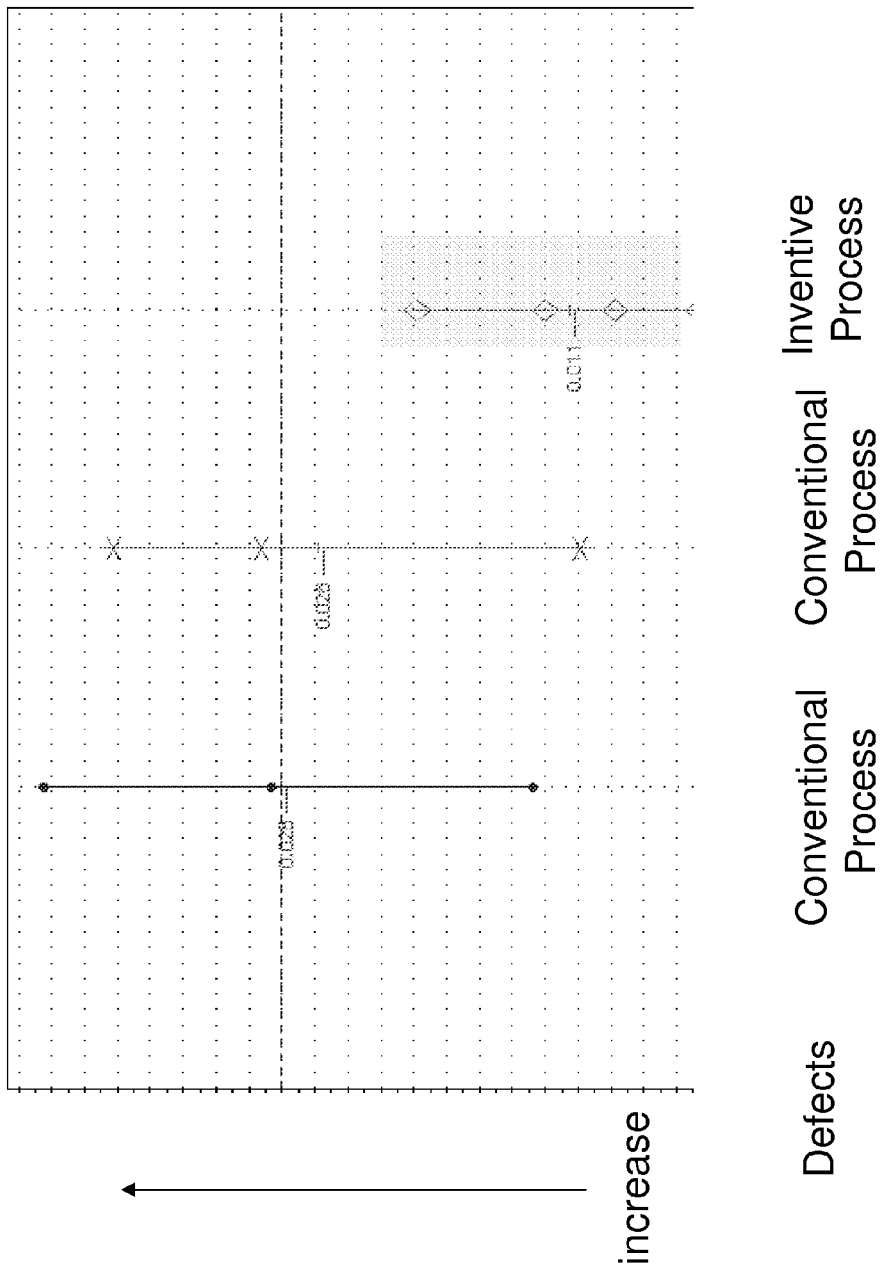
FIGS. 5A and 5B graphically show a comparison of surface wafer defects in different wiring layers.
Figure 5B:
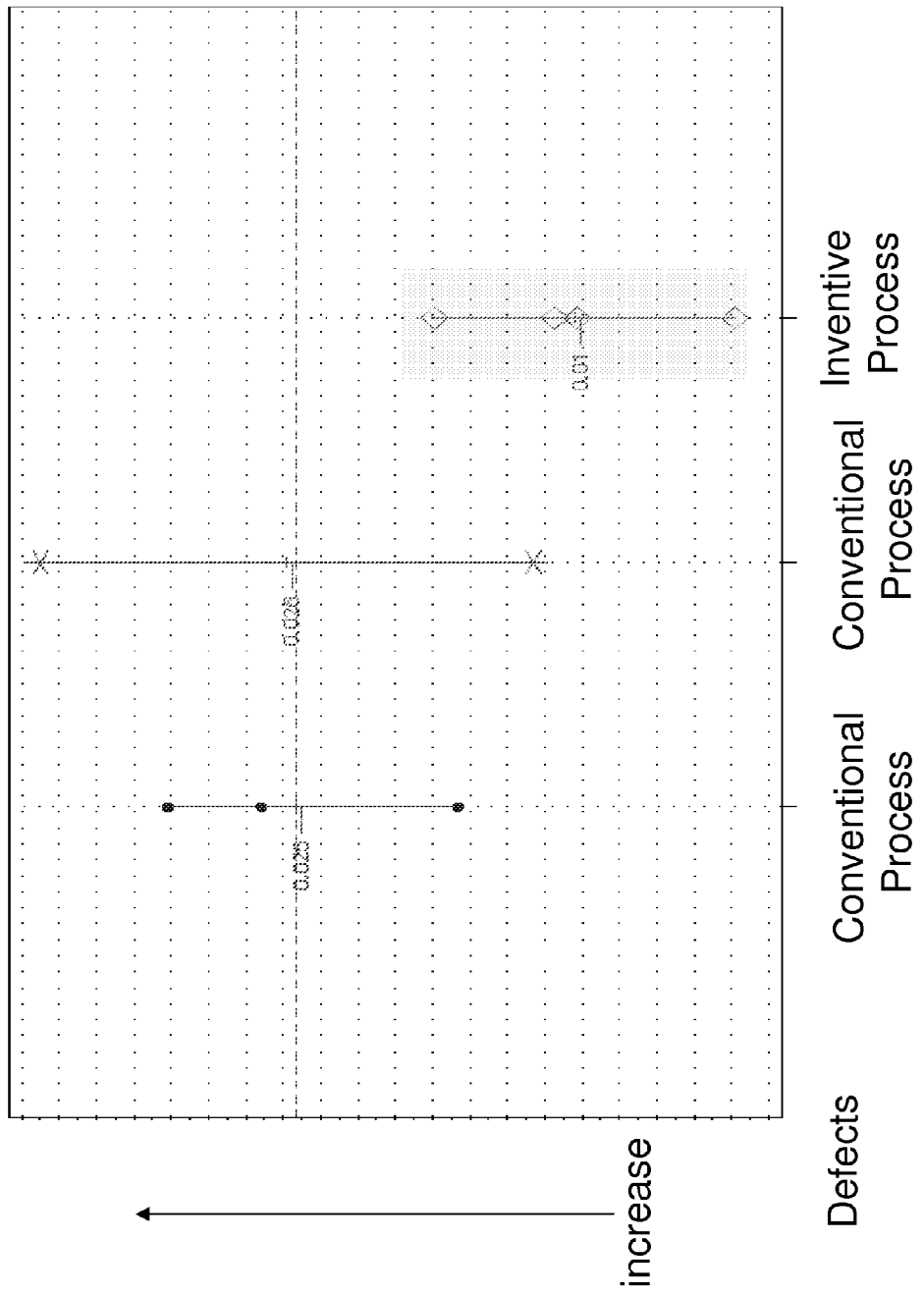

FIGS. 5A and 5B graphically show a comparison of surface wafer defects in different wiring layers. More specifically, FIG. 5A shows surface wafer defects in an M1 wiring layer; whereas, FIG. 5B shows surface wafer defects in an M3 or upper wiring layer. The graphs of FIGS. 5A and 5B are a result of conventional surface wafer defect scans.

As shown in both FIGS. 5A and 5B, the density of defects (number of defects/cm$^2$) is less using the processes in accordance with the invention. Said otherwise, using two conventional processes results in more defects per cm$^2$ compared to using the processes in accordance with the invention. The reduction in the creation of defects shown in FIGS. 5A and 5B result from the processes in accordance with the first aspect of the invention, e.g., introducing nitrogen into the chamber at a flow rate of 80 sccm for about 15 seconds and maintaining such flow rate throughout the PVD process.

While the invention has been described in terms of embodiments, those of skill in the art will recognize that the invention can be practiced with modifications and in the spirit and scope of the appended claims.

What is claimed is:

1. A method of fabricating a semiconductor structure comprising increasing a mol percent of nitride with respect to a total tantalum plus nitride to 25% or greater during a barrier layer fabrication process,
   wherein the mol percentage of the nitride is increased by introducing nitrogen as a heat transfer medium between a wafer and a chuck such that the nitrogen leaks from a back side of the wafer to a surface of the wafer.

2. The method of claim 1, wherein the mol percentage of the nitride is increased to a range of about 25% to 90%.

3. The method of claim 2, wherein the mol percentage of the nitride is increased to a range of about 30% to 35%.

4. The method of claim 3, wherein the mol percentage of the nitride is increased by introducing nitrogen into a chamber prior to a Pressure Vapor Deposition (PVD) process.

5. The method of claim 4, wherein a ratio of nitrogen to argon during the PVD process is at a ratio of about 2.5:1 or greater.

6. The method of claim 4, wherein the nitrogen is provided at a flow rate of between about 5 sccm to 300 sccm.

7. The method of claim 6, wherein the nitrogen is provided at a flow rate of about 80 sccm.

8. The method of claim 1, wherein the mol percentage of the nitride is increased by providing a power to the chamber of between about 100 W to 2 KW.

9. The method of claim 1, wherein the mol percentage of the nitride is increased by providing a negative charge to a wafer during a PVD process.

10. The method of claim 9, wherein the negative voltage is in a range of about −25V to −500V.

11. The method of claim 1, wherein a flow rate of the nitrogen is between about 5 sccm to 100 sccm.

12. The method of claim 11, wherein the flow rate of the nitrogen is about 20 sccm.

13. The method of claim 1, wherein the mol percentage of the nitride is increased by increasing a pressure of a chamber during a PVD process to about 20 mT.

14. A method of fabricating a semiconductor structure comprising adjusting a parameter in a chamber to increase a mol percent of nitride to 25% or greater with respect to a total tantalum plus nitride during a Pressure Vapor Deposition (PVD) process,
   wherein the adjusting includes introducing nitrogen as a heat transfer medium between a wafer and a chuck such that the nitrogen leaks from a back side of the wafer to a surface of the wafer.

15. The method of claim 14, wherein the adjusting includes introducing nitrogen into the chamber prior to the PVD process.

16. The method of claim 14, wherein the nitrogen is at a ratio with respect to argon of about 2.5:1 or greater.

17. The method of claim 14, wherein the nitrogen is provided at a flow rate of about 5 sccm to 300 sccm.

18. The method of claim 14, wherein the adjusting includes decreasing a power to the chamber to between about 100 W to 2 KW.

19. The method of claim 14, wherein the adjusting includes increasing a pressure of a chamber during the PVD process to about 20 mT.

20. The method of claim 14, wherein the mol percentage of nitride is increased to a range of about 30% to 35%.

21. The method of claim 14, wherein the adjusting includes providing a negative voltage to a wafer.

22. The method of claim 21, wherein the negative voltage is in a range of about −25V to −200V.

23. A method of depositing a barrier layer in a trough or via, comprising introducing nitrogen into a deposition chamber such that a resultant mol percentage of nitride with respect to tantalum plus nitride is about 25% to 90%,
   wherein the introducing nitrogen includes introducing nitrogen as a heat transfer medium between a wafer and a chuck such that the nitrogen leaks from a back side of the wafer to a surface of the wafer, wherein a flow rate of the nitrogen is between about 5 sccm to 100 sccm.

24. The method of claim 23, wherein the introducing of nitrogen comprises at least one of:
   introducing nitrogen into the chamber prior to a PVD process, wherein a ratio of nitrogen to argon during the PVD process is at a ratio of greater than 2.5:1;
   providing a power to the chamber of between about 100 W to 2 KW;
   attenuating a voltage applied to the wafer to a range of about −25V to −200V; and
   increasing a pressure of the chamber during the PVD process to about 20 mT.

* * * * *